(12) United States Patent
Cheung

(10) Patent No.: US 9,711,376 B2
(45) Date of Patent: Jul. 18, 2017

(54) SYSTEM AND METHOD FOR MANUFACTURING A FABRICATED CARRIER

(71) Applicant: Enablink Technologies Limited, Tsuen Wan, Hong Kong (CN)

(72) Inventor: Ka Wa Cheung, Tuen Mun (CN)

(73) Assignee: ENABLINK TECHNOLOGIES LIMITED, Kowloon (HK)

( * ) Notice: Subject to any disclaimer, the term of this patent is extended or adjusted under 35 U.S.C. 154(b) by 137 days.

(21) Appl. No.: 14/561,501

(22) Filed: Dec. 5, 2014

(65) Prior Publication Data

US 2015/0162215 A1    Jun. 11, 2015

Related U.S. Application Data

(60) Provisional application No. 61/912,755, filed on Dec. 6, 2013.

(51) Int. Cl.
*H01K 3/10*  (2006.01)
*H01L 21/48* (2006.01)
(Continued)

(52) U.S. Cl.
CPC .............. *H01L 21/486* (2013.01); *C25D 7/12* (2013.01); *C25D 9/04* (2013.01); *H01L 23/3128* (2013.01); *H01L 23/49816* (2013.01); *H01L 23/49827* (2013.01); *H01L 23/49838* (2013.01); *H05K 1/111* (2013.01); *H01L 2224/48091* (2013.01);
(Continued)

(58) Field of Classification Search
CPC ....... C25D 7/12; C25D 9/04; H01L 23/49816; H01L 23/49827; H01L 23/3128; H01L 23/49838; H01L 21/486; H01L 2924/181; H01L 2224/48091; H01L 2224/49171; H01L 2224/73265; H01L 2924/00014; H01L 2924/00012; H05K 1/111;
(Continued)

(56) References Cited

U.S. PATENT DOCUMENTS 5,260,518 A * 11/1993 Tanaka ................ H01L 21/4853
                                                                174/255
6,163,957 A * 12/2000 Jiang ................... H01L 21/4857
                                                                29/852

(Continued)

FOREIGN PATENT DOCUMENTS

EP    1 271 644 A1    1/2003

OTHER PUBLICATIONS

Official Communication issued in corresponding European Patent Application No. 14196620.0, mailed on Apr. 30, 2015.

(Continued)

*Primary Examiner* — Donghai D Nguyen
(74) *Attorney, Agent, or Firm* — Keating and Bennett, LLP

(57) ABSTRACT

A method and apparatus for fabricating a carrier having a top surface and a bottom surface, the method comprising combining a conductive portion at the top surface and a dielectric at the bottom surface, wherein the dielectric includes contact island cavities, filling one or more of the contact island cavities with solder metal to form solder islands, selectively metal plating the conductive portion, selectively etching a portion of the conductive portion, and applying solder resist to the selectively plated and etched top surface of said conductive portion.

21 Claims, 23 Drawing Sheets

(51) Int. Cl.
    *C25D 7/12* (2006.01)
    *C25D 9/04* (2006.01)
    *H01L 23/498* (2006.01)
    *H05K 1/11* (2006.01)
    *H01L 23/31* (2006.01)

(52) U.S. Cl.
    CPC ............... *H01L 2224/49171* (2013.01); *H01L 2224/73265* (2013.01); *H01L 2924/181* (2013.01); *Y10T 29/49165* (2015.01)

(58) Field of Classification Search
    CPC ......... Y10T 29/49126; Y10T 29/49155; Y10T 29/49165
    USPC .................... 29/830, 846, 852; 174/251, 260
    See application file for complete search history.

(56) References Cited

U.S. PATENT DOCUMENTS

| | | | |
|---|---|---|---|
| 6,528,869 B1 | 3/2003 | Glenn et al. | |
| 6,670,718 B2 * | 12/2003 | Matsuura | H01L 23/49811 174/251 |
| 7,064,012 B1 | 6/2006 | Lin | |
| 2004/0175582 A1 | 9/2004 | Brenneman et al. | |
| 2009/0102050 A1 | 4/2009 | Hsu | |
| 2009/0314525 A1* | 12/2009 | Kajino | H05K 1/0265 29/846 |
| 2010/0044845 A1 | 2/2010 | Funaya et al. | |
| 2010/0288541 A1 | 11/2010 | Appelt et al. | |
| 2012/0020026 A1 | 1/2012 | Oganesian et al. | |
| 2012/0085572 A1 | 4/2012 | Sakai | |

OTHER PUBLICATIONS

Official Communication issued in related European Patent Application No. 14196621.8, mailed on Apr. 30, 2015.

Official Communication issued in related European Patent Application No. 14196619.2, mailed on Jul. 9, 2015.

Cheung; "System and Method for Manufacturing a Cavity Down Fabricated Carrier"; U.S. Appl. No. 14/561,499, filed Dec. 5, 2014.

Cheung; "System and Method for Manufacturing a Fabricated Carrier"; U.S. Appl. No. 14/561,493, filed Dec. 5, 2014.

* cited by examiner

SYSTEM AND METHOD FOR MANUFACTURING A FABRICATED CARRIER

RELATED APPLICATIONS

This application claims priority from U.S. patent application 61/912,755, filed Dec. 6, 2014. Priority is claimed to this earlier filed application and the contents of this earlier filed application are incorporated herein, in its entirety, by reference.

FIELD OF INVENTION

The present invention relates generally to integrated circuit packaging and more particularly to a system and method for manufacturing a fabricated carrier.

BACKGROUND

Various processes exist for forming a fabricated carrier. For example, fabrication can be done by means of fabricating a polyimide carrier laminated with metal foil with the aid of an adhesive, followed by patterning the metal and selectively plating the metal portion. This is not a cost effective way to make such a carrier since the polyimide is relatively expensive. Alternatively fabrication can be based on multi-layer PCB laminate methods. Carrying out these methods is relatively costly with long cycle time processes since drilling needs to be performed by means of either laser or a mechanical drill.

SUMMARY

It is an object of an aspect of the present invention to provide a novel system and method for fabricating a carrier that obviates and mitigates at least one of the above-identified disadvantages of the prior art.

Aspects and advantages will be subsequently apparent, and reside in the details of construction and operation as more fully hereinafter described and claimed, reference being had to the accompanying drawings forming a part hereof, wherein like numerals refer to like parts throughout.

BRIEF DESCRIPTION OF DRAWINGS

FIGS. 3(a)-(c), shows a bottom view of a system for carrier fabrication in accordance with an aspect of the invention;

FIGS. 4(a)-(c), shows a carrier in accordance with an aspect of the invention;

FIGS. 8(a)-(c), shows a diagram of a carrier in accordance with an aspect of the invention;

FIGS. 9(a)-(c), shows a diagram of a carrier in accordance with an aspect of the invention;

FIGS. 12(a)-(c), shows a block diagram of a mold for molding dielectric portions of carrier, according to an aspect of the invention;

FIGS. 14(a)-(d), shows a cross-sectional view of a carrier in accordance with an aspect of the invention;

FIGS. 16(a)-(c), shows a cross-sectional view of a carrier in accordance with an aspect of the invention;

FIGS. 17(a)-(c), shows a diagram of a carrier in accordance with an aspect of the invention;

FIGS. 18(a)-(c), shows a diagram of a carrier in accordance with an aspect of the invention;

FIGS. 19(a)-(c), shows a diagram of a carrier in accordance with an aspect of the invention;

FIGS. 20(a)-(c), shows a diagram of a carrier in accordance with an aspect of the invention;

FIGS. 21(a)-(c), shows a diagram of a carrier in accordance with an aspect of the invention;

FIGS. 22(a)-(c), shows a diagram of a carrier in accordance with an aspect of the invention; FIGS. 23(a)-(c), shows a diagram of a carrier in accordance with an aspect of the invention.

DETAILED DESCRIPTION

Figure 1:
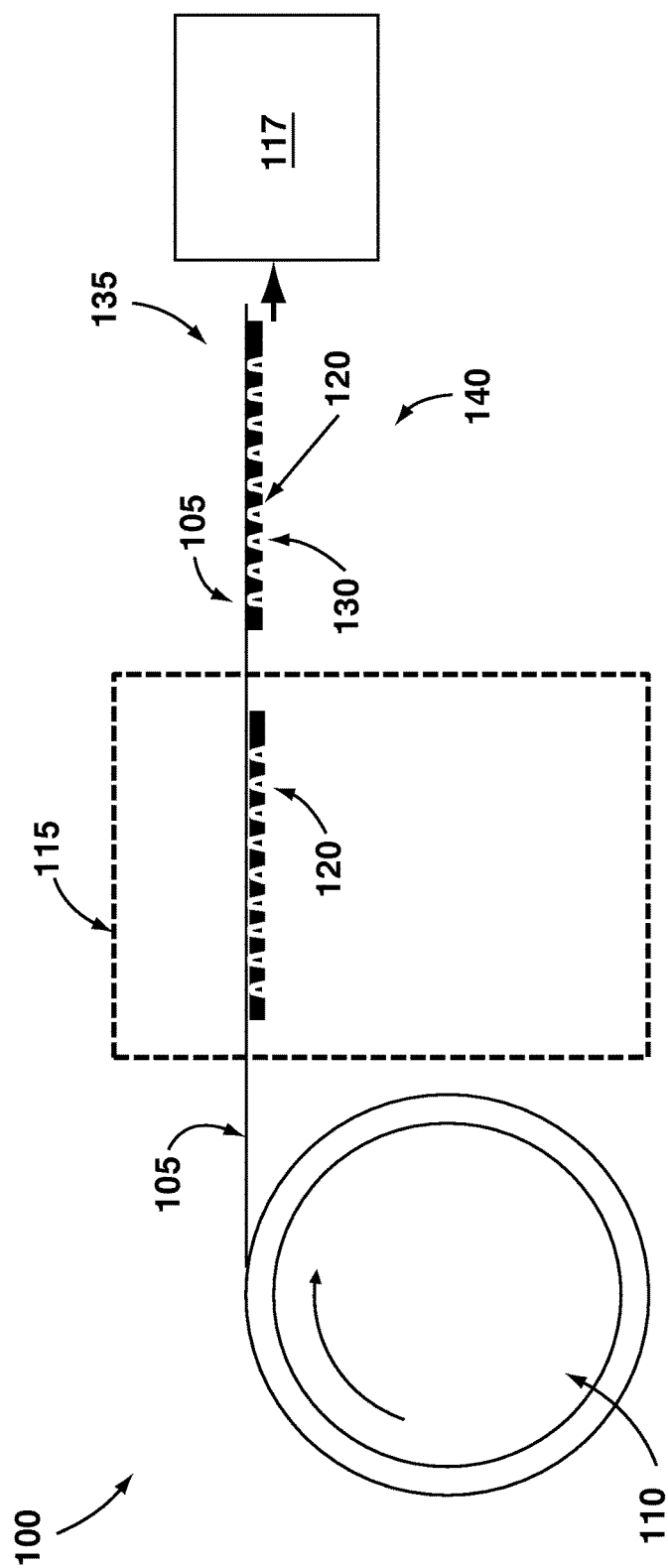
FIG. 1 shows a side view of a system for carrier fabrication in accordance with an aspect of the invention.

FIG. 1 shows a side view of a system 100 for fabricating a carrier in accordance with one implementation. System 100 is a simplified example provided for illustrative purposes only, and should not be interpreted to limit implementations. Conductive portion 105, which can be a foil made of metals such as copper, is fed from a spool 110. The thickness of conductive portion 105 can vary, for example at 18 um, 10 um or thinner. Conductive portion 105 is fed into a molding tool 115, which selectively deposits a specified thickness and shape of dielectric material, referred to herein as dielectric portion 120, on conductive portion 105, at a specified position. The dielectric portion 120 may be formed from a polymerized molding compound based, for example, on a binding material such as an epoxy and filled with inorganic fillers such as silicon dioxide or silicon carbide, or it may be any suitable plastic compound. In some implementations, dielectric portion 120 is composed of a molding compound that can be molded by being exposed to high temperatures to reduce viscosity, allowing the molding compound to be molded by molding tool 115. In further implementations, dielectric portion 120 can be combined directly with the conductive portion 105 wherein the dielectric portion 120 binds directly to the conductive portion 105 without the aid of an additional adhesive layer between the dielectric portion 120 and the conductive portion 105. For example, in variations, a binding material included in the molding material can facilitate the direct binding of dielectric portion 120 and conductive portion 105.

The dielectric portion 120 can be formed into any predetermined thickness. An example thickness for dielectric portion 120 is approximately 0.1 mm. In some implementations, the dielectric portion 120 may be deposited with fully or partially populated cavities and/or micro cavities 130, as indicated in FIG. 1. The cavities can be of a predetermined shape such as trapezoidal or conical. For example, and as shown in FIG. 1, the cavities can be conical, with smaller openings on the top surface 135 and larger openings at bottom surface 140.

Following the combining of dielectric and conductive portions by molding tool 115, downstream processing such as metallization and etching are performed, as described in greater detail below. Although details of an implementation of downstream processing such as metallization and etching are described below, details of the apparatus for performing such downstream processing are not provided herein, but would be known to a person of skill in the art, and are represented by downstream processing system 117 in FIG. 1.

Figure 2:
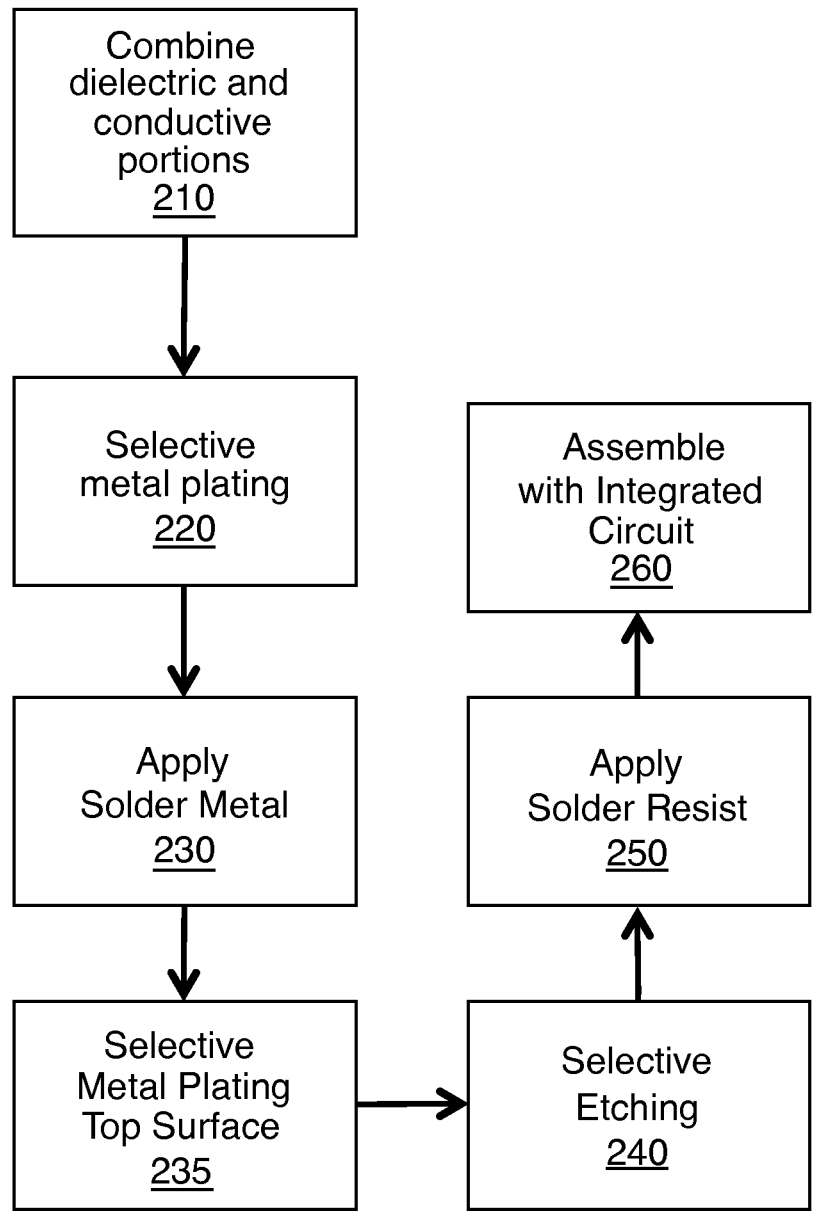
FIG. 2 shows a flow chart showing a method of carrier fabrication in accordance with an aspect of the invention.

Referring now to FIG. 2, a method of carrier fabrication is indicated generally at 200. In order to assist in the explanation of the method, it will be assumed that method 200 is operated using system 100 as shown in FIG. 1. Additionally, the following discussion of method 200 leads to a further understanding of system 100. However, it is to be understood that system 100, and method 200 can be varied, and need not work exactly as discussed herein in conjunction with each other, and that such variations are within scope the scope of the present invention as defined by the claims appended hereto.

Figure 3:
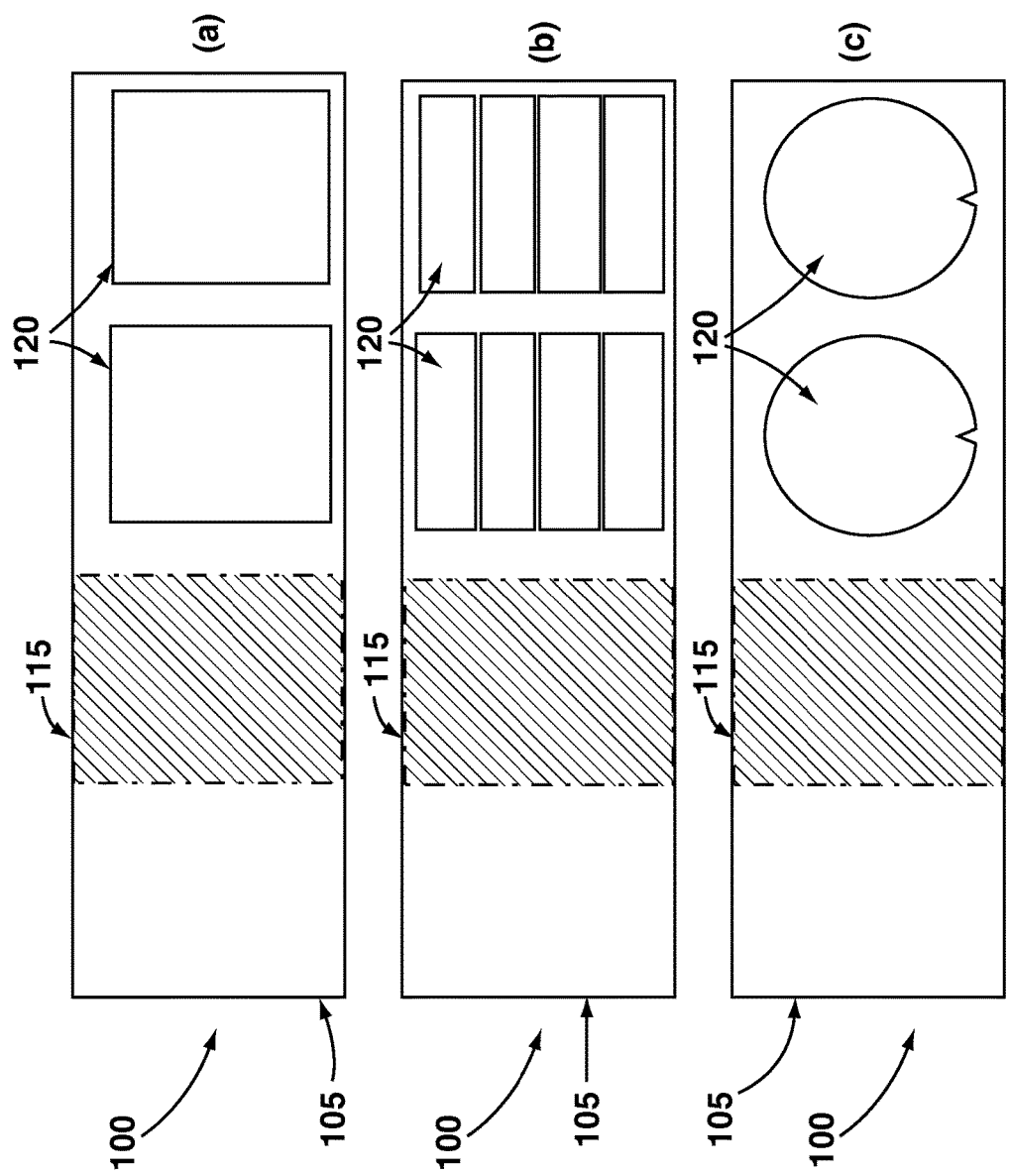
FIG. 3, comprising

At 210, a dielectric portion is combined with a conductive portion, for example by molding tool 115. Referring to FIG. 3, the conductive portion 105 is shown from a bottom view, as it exits the molding tool 115, illustrating exemplary shapes and placements of dielectric portion 120 deposited onto conductive portion 105 by the molding tool 115. FIG. 3(a) shows dielectric portion 120 in the form of molded panels, FIG. 3(b) shows dielectric portion 120 in the form of molded strips and FIG. 3(c) shows dielectric portion 120 in the form of molded panels in wafer form. A person of skill in the art will understand that other shapes and placement are possible.

Figure 4:
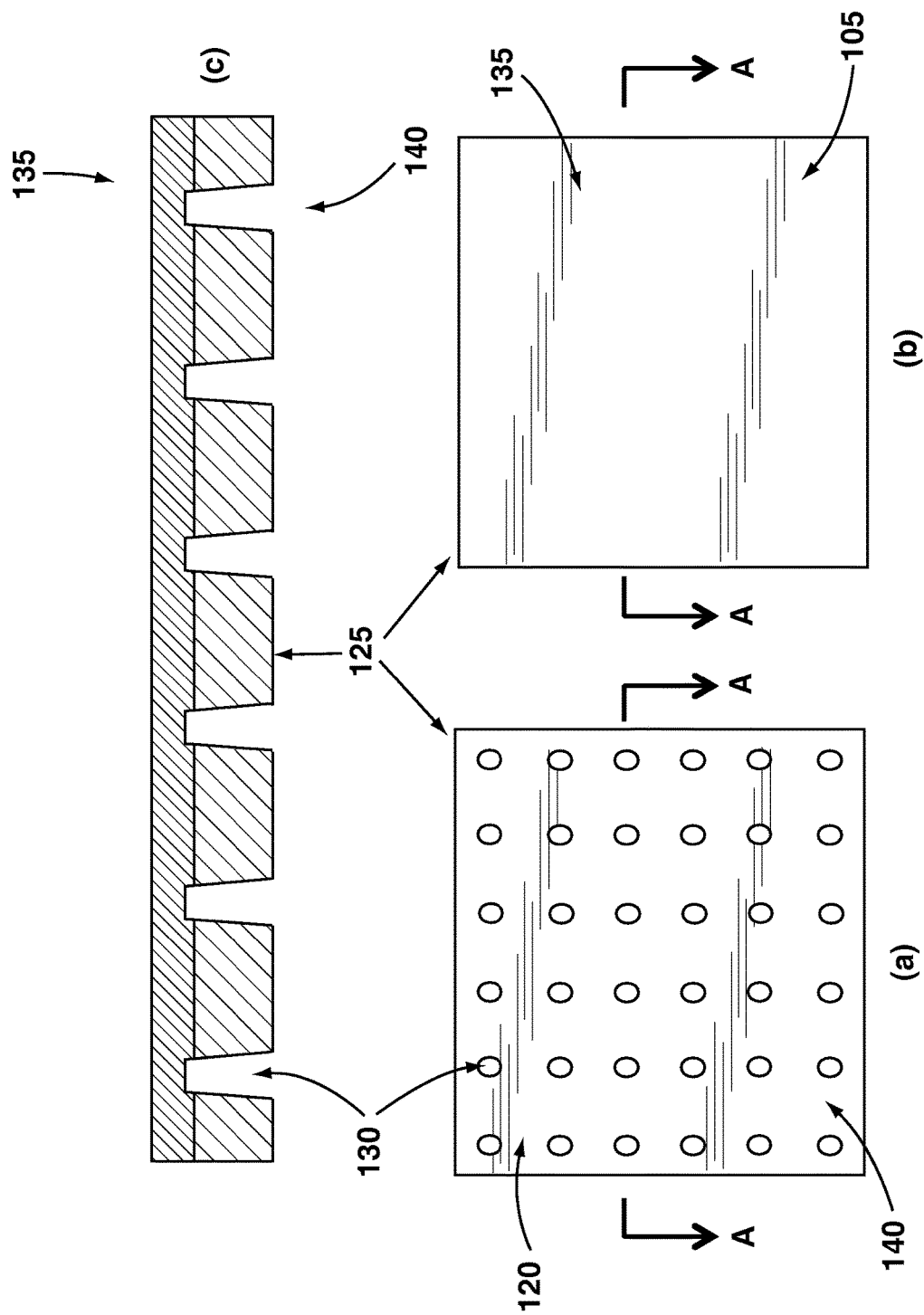
FIG. 4, comprising

Referring now to FIG. 4, a section 125 of the combined conductive portion 105 and dielectric portion 120 is shown from various views. The illustrated section 125 represents a part of the strip/panel or wafer shaped assembly of conductive portion 105 and dielectric portion 120 that has been singulated through known methods such as saw singulation or laser cutting, for example at the end of the process. FIG. 4(a) is a view of the bottom surface 140 of the section 125. FIG. 4(b) is a view of the top surface 135 of the section 125, and FIG. 4(c) is a cross-sectional view along A-A. As can be seen in FIGS. 4(a) and 4(c), the dielectric portion 120 includes contact island cavities 130. Indeed, as described above, in variations, the molding process can be adjusted to deposit the dielectric material 120 such that it includes different numbers, shapes and sizes of cavities.

Figure 5:
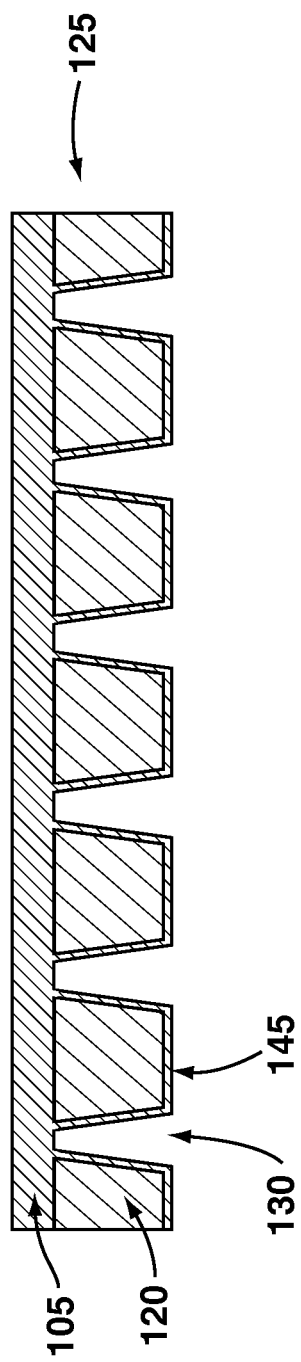
FIG. 5 shows a side view of a carrier in accordance with an aspect of the invention.

Referring now to FIG. 5, in some implementations, at step 220, at least a portion of the exposed surface of the dielectric portion 120, including the surface of cavities 130, may be metalized to form metalized portion 145. The metallization can be achieved by either sputtering onto the dielectric portion 120 a metal seed layer (such as chromium or titanium) or by immersing the section 125 in a molten metal such as copper. The seeding or immersion plating can be followed by further electrolytic plating to achieve a predetermined thickness.

Figure 6:
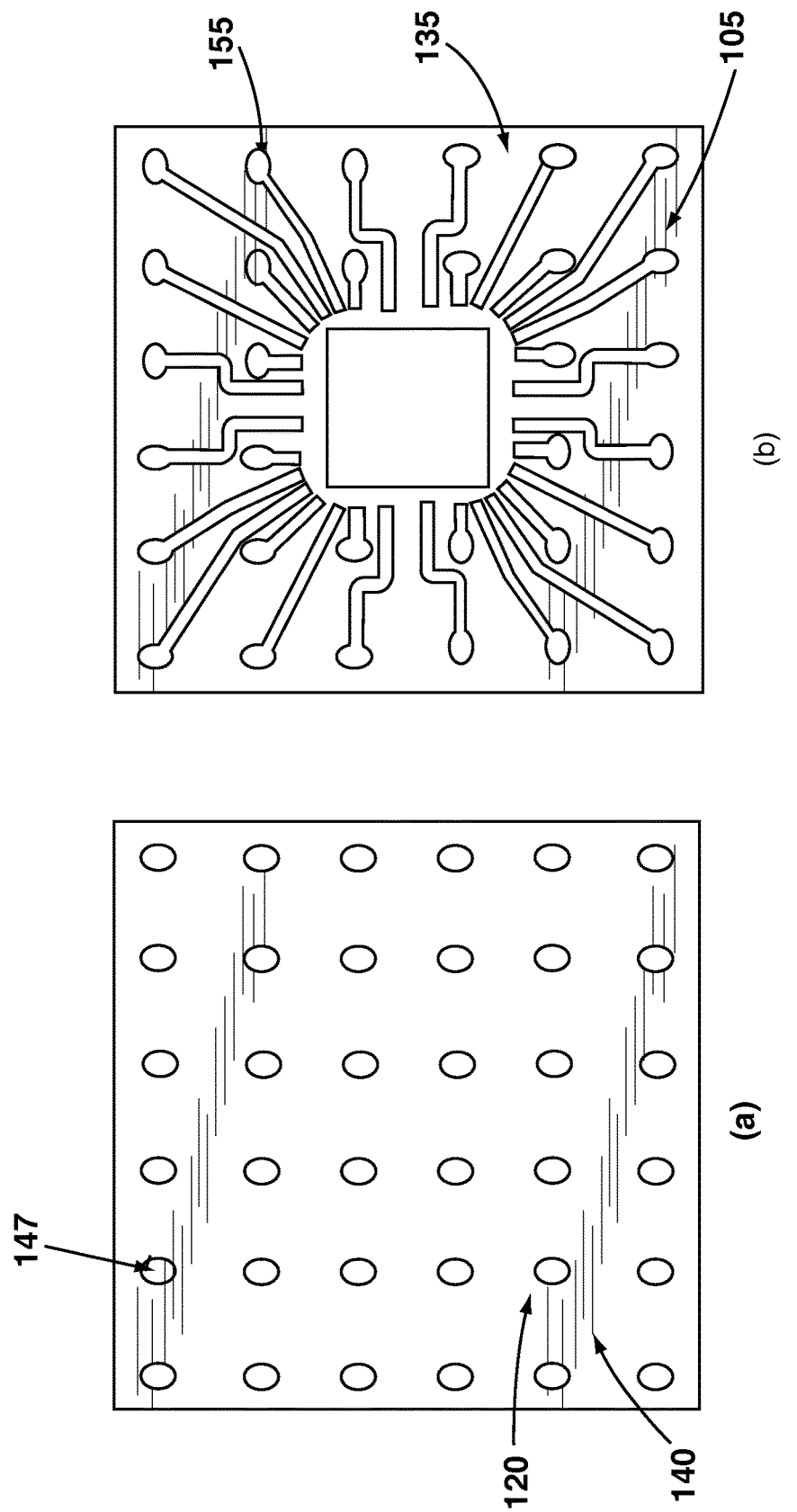
FIG. 6, comprising FIGS. 6(a) and (b), shows a carrier in accordance with an aspect of the invention.

With reference to FIG. 6, at step 230, contact island cavities 130 (optionally metalized in accordance with step 220) are filled with solder metal 147. Solder metal used can include materials such as SnAg, SnAgCu, SnCu and others that will occur to a person of skill. In some implementations, to apply solder metal, cavities 130 can be filled by stencil printing solder paste with a predetermined composition onto the exposed side of the dielectric portion 120. The dielectric portion 120 can then be reflowed with the pre-printed solder paste. The solder islands can subsequently be flattened after the reflow, for example by means of pressurized rolling or coining.

At 235, the exposed portion of copper foil 105, namely the top surface 135 of section 125 can be selectively plated as illustrated in FIG. 6, where the selective plating is indicated at 155. FIG. 6(a) is a view of the bottom surface 140 of section 125 and FIG. 6(b) is view of the top surface 140 of section 125. As can be seen in FIG. 6(b), metal plating 155 can be selectively deposited on at least a part of conductive portion 105, in accordance with a predetermined shape and/or pattern. In some implementations, to carry out selectively plating, photo-imageable plating resist is applied to the top and bottom side of the carrier 125. The top surface 135 is then exposed to the predetermined image shape and/or pattern. Next, the plating resist is developed and the specified metal shape and/or pattern is plated as indicated at 155. The metal used can be Ag, Ni/Au, Pd and others that will now occur to a person of skill. Finally, the plating resist is stripped away.

Figure 7:
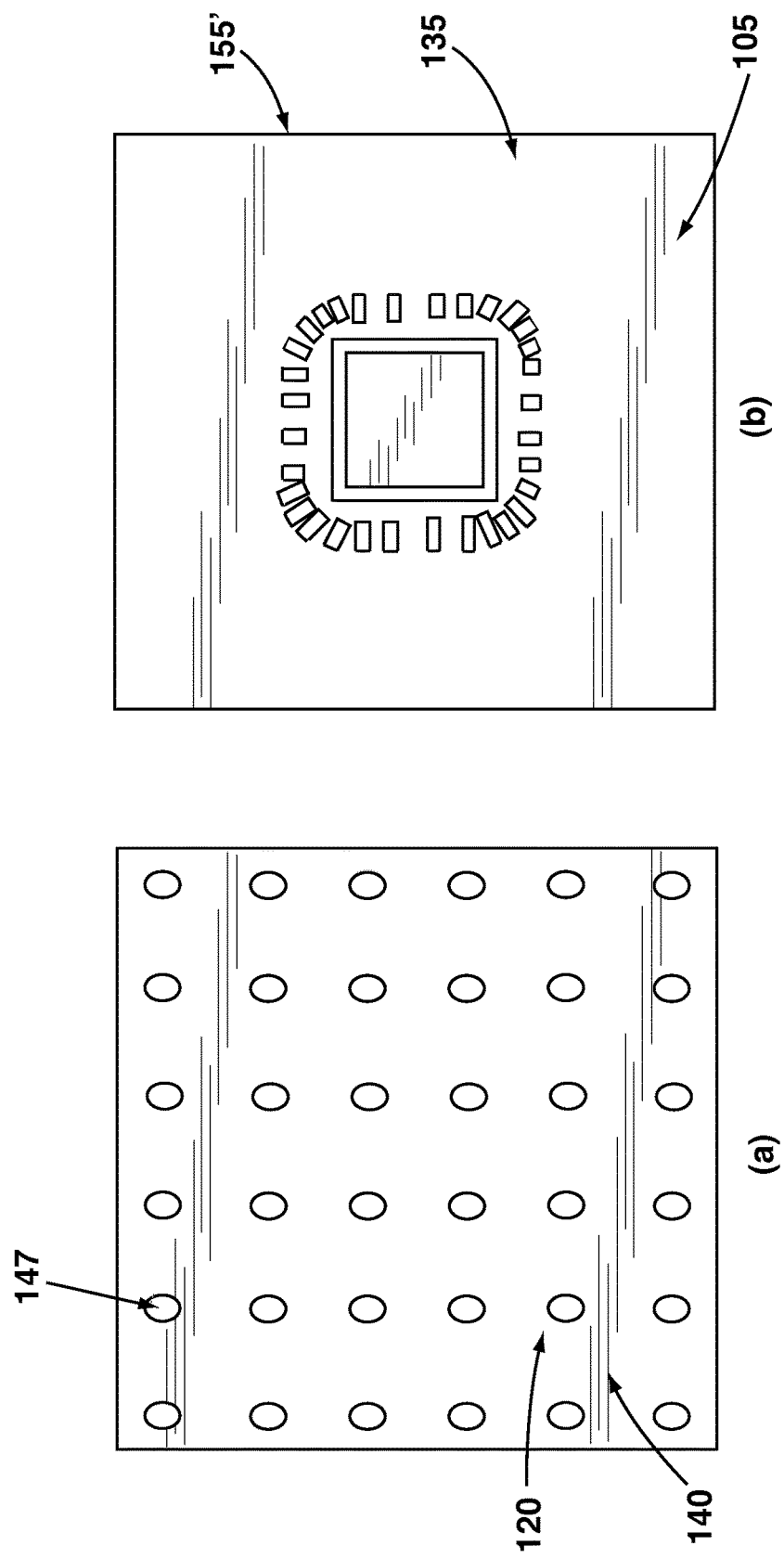
FIG. 7, comprising FIGS. 7(a) and (b), shows a diagram of a carrier in accordance with an aspect of the invention.

In some implementations, method 200 can be varied to apply alternative plating patterns as indicated at 155' in FIG. 7. FIG. 7(a) is a view of the bottom surface 140 of section 125 and FIG. 7(b) is a view of the top surface 135 of section 125. As can be seen in FIG. 7(b), metal plating 155' can be selectively deposited on predetermined parts of conductive part 105. In this variation, to carry out selectively plating, photo-imageable plating resist is applied to the top surface 135 and bottom surface 140 of section 125. The top surface 135 is then exposed to a selected image pattern. Next, the plating resist is developed and the specified metal pattern is plated as indicated at 155'. The metal used can be Ag, Ni/Au, Pd and others that will now occur to a person of skill. Finally, the plating resist is stripped away.

Figure 8:
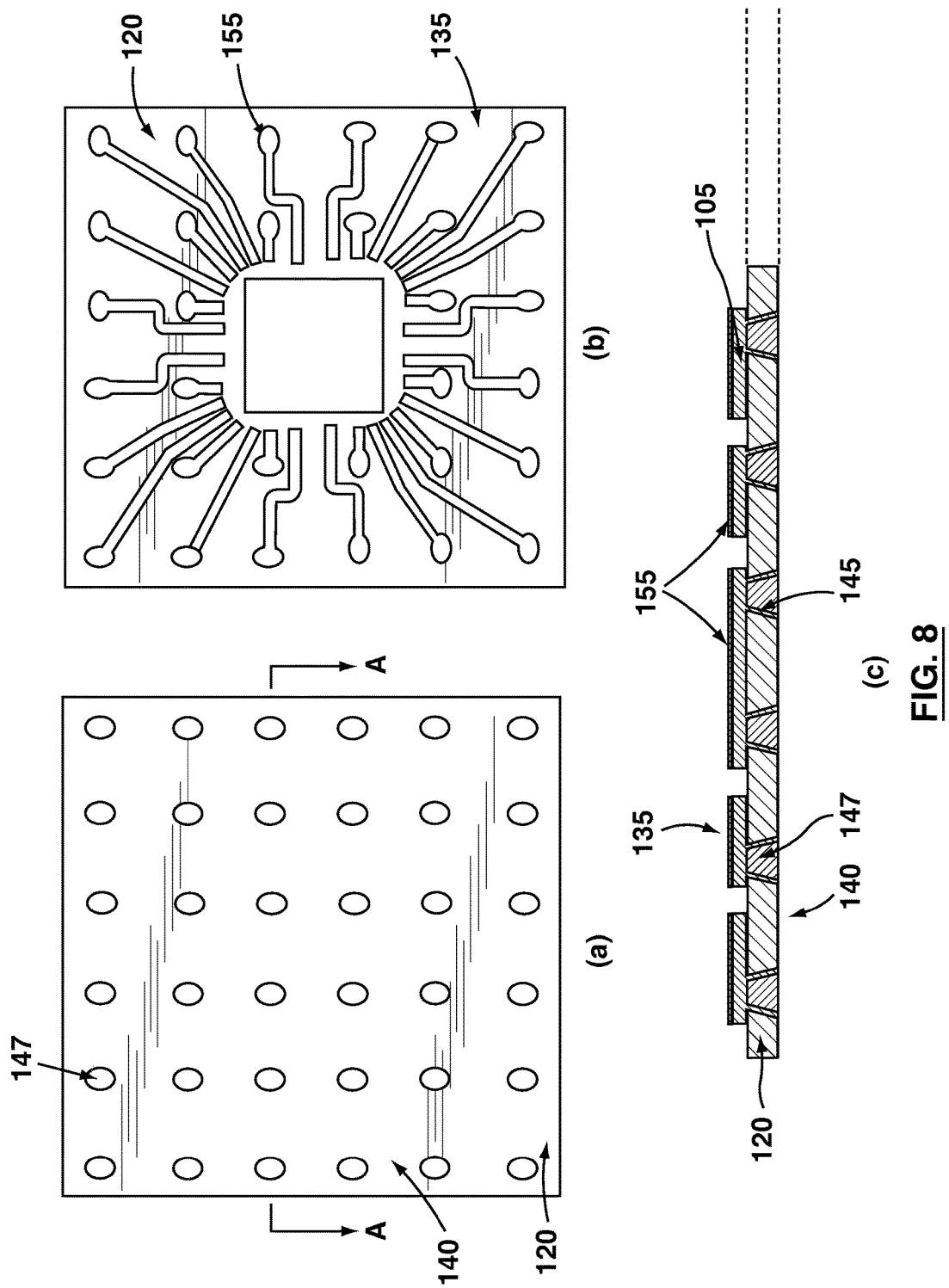
FIG. 8, comprising

Continuing with the manufacturing process 200, at 240, at least some of foil 105 is selectively etched away. Referring to FIG. 8, section 125 is shown after portions of conductive portion 105 are etched away. The etching can be done in accordance with a predetermined shape and/or pattern. FIG. 8(a) is a view of bottom surface 140 of section 125, FIG. 8(b) is a view of the top surface 135 of section 125 and FIG. 8(c) is a cross-sectional view of section 125 along the dotted lines A-A. As can be seen in FIGS. 8(b) and 8(c), in this example, all portions of conductive portion 105 that have not been plated with plating 155 have been etched away, exposing dielectric portion 120 at the top surface 135.

In some implementations, in order to carry out selective etching of conductive portion 105 in accordance with a predetermined shape and/or pattern, photo imageable etching resist is applied to the top surface 135 and a predetermined image pattern is exposed. The etching resist is developed and the shape and/or pattern defined by the etching resist is exposed. Finally, the etching resist on the top surface 135 is stripped away. In implementations where the dielectric portion 120 forming the bottom surface 140 has been metalized, as described above, the metalized portion at the bottom surface 140 can also be etched away with the exception of the solder; solder being an etching resist.

Figure 9:
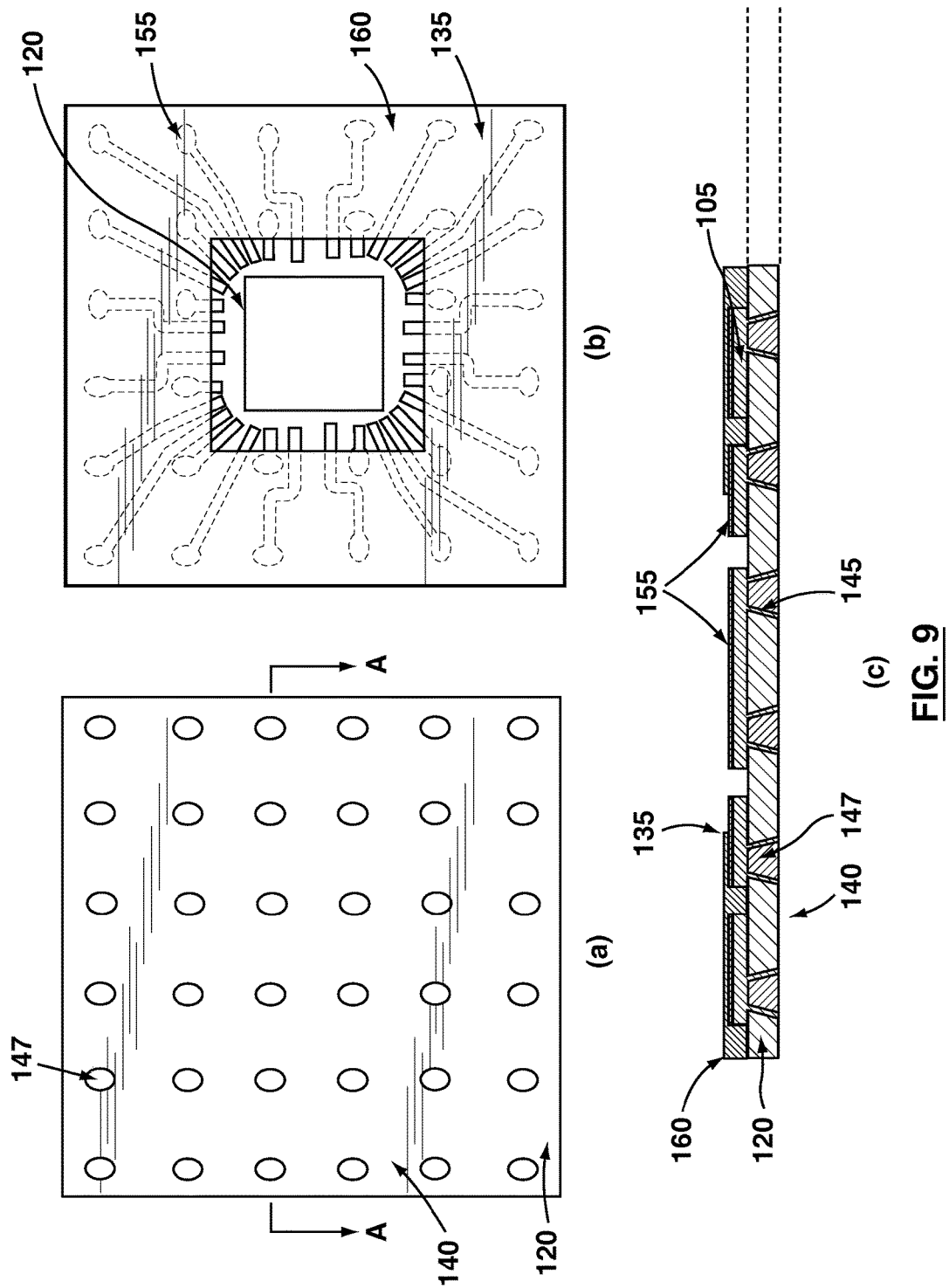
FIG. 9, comprising

At 250, solder resist can be applied selectively in accordance with a selected shape and pattern on top of the metal pattern using traditional methods. FIG. 9 shows solder resist applied to the top surface 135 of section 125 as indicated at 160. Solder resist 160 is typically in the form of a thin lacquer-like layer of polymer that is applied to the selectively plated portions for protection against oxidation and to prevent solder bridges from forming between closely spaced solder pads. FIG. 9(a) is a view of bottom surface 140 of section 125, FIG. 9(b) is a view of the top surface 135 of section 125 and FIG. 9(c) is a cross-sectional view of section 125 along the dotted lines A-A. Solder resist can be applied based on a predetermined shape or pattern.

At 260, the integrated circuits are assembled with the section 125 as a carrier. As discussed above, singulation of the 125 typically occurs at this stage of the manufacturing process. FIGS. 16-25, discussed in greater detail below, illustrate example processes for carrying this out.

Figure 10:
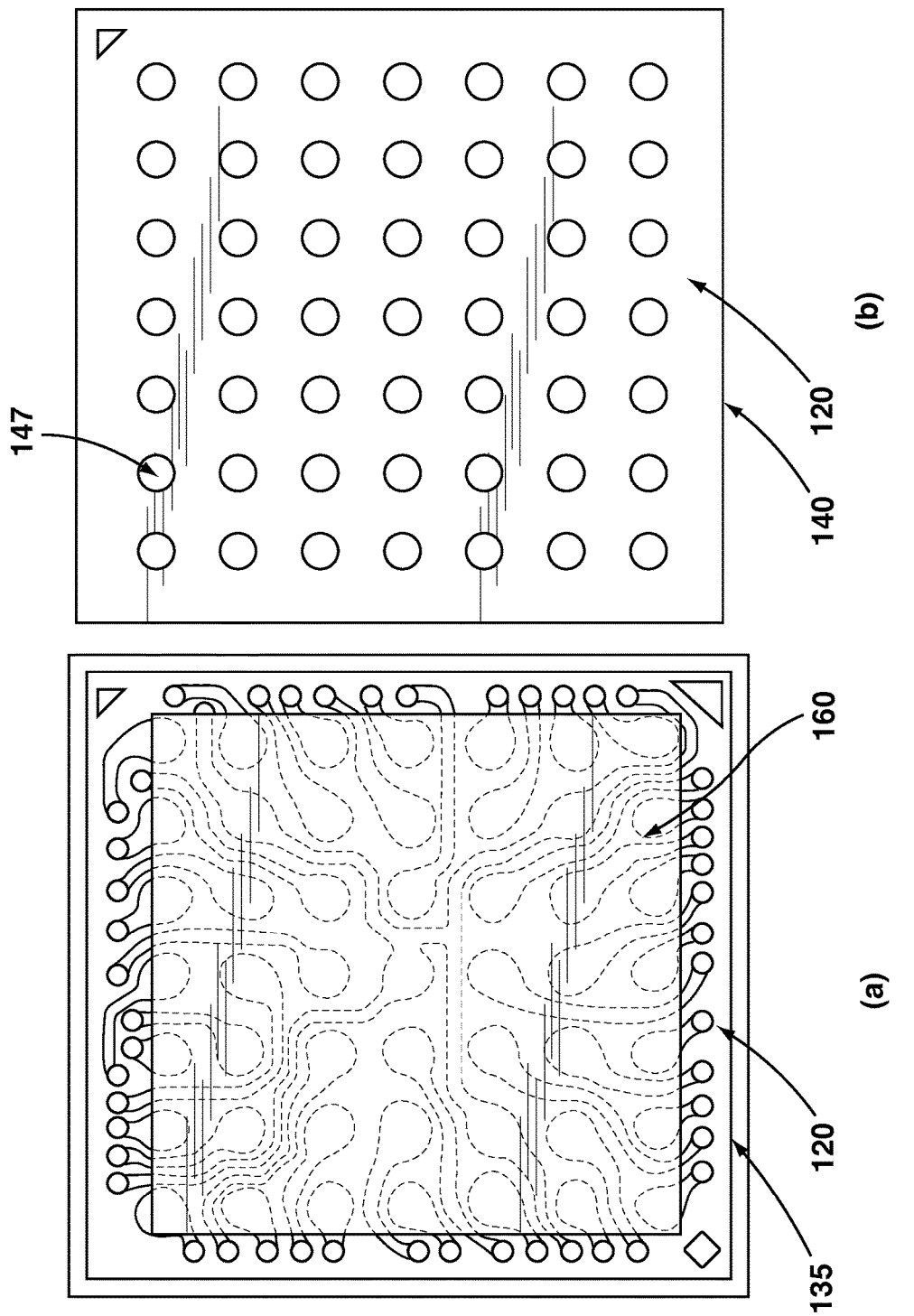
FIG. 10, comprising FIGS. 10(a) and (b), shows a diagram of a carrier in accordance with an aspect of the invention.
Figure 11:
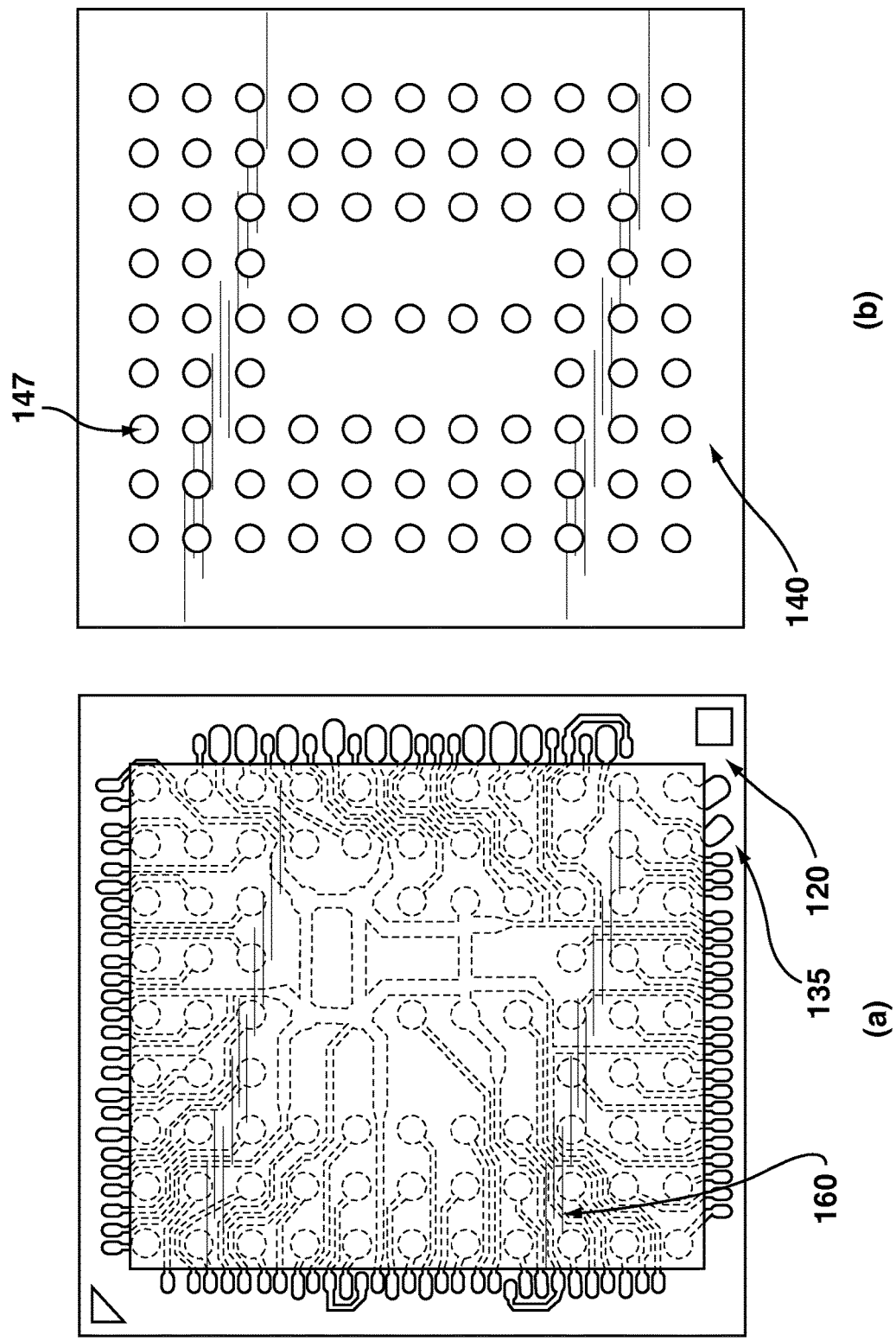
FIG. 11, comprising FIGS. 11(a) and (b), shows a diagram of a carrier in accordance with an aspect of the invention.

In other variations, different cavity, metal plating and solder resist shapes and/or patterns can be implemented. FIGS. 10 and 11 illustrate two example variations in pattern and shape, wherein FIGS. 10(a) and 11(a) are views of the top surfaces of section 125 and FIGS. 10(b) and 11(b) are views of the bottom surface of section 125 in accordance with these variations.

Figure 12:
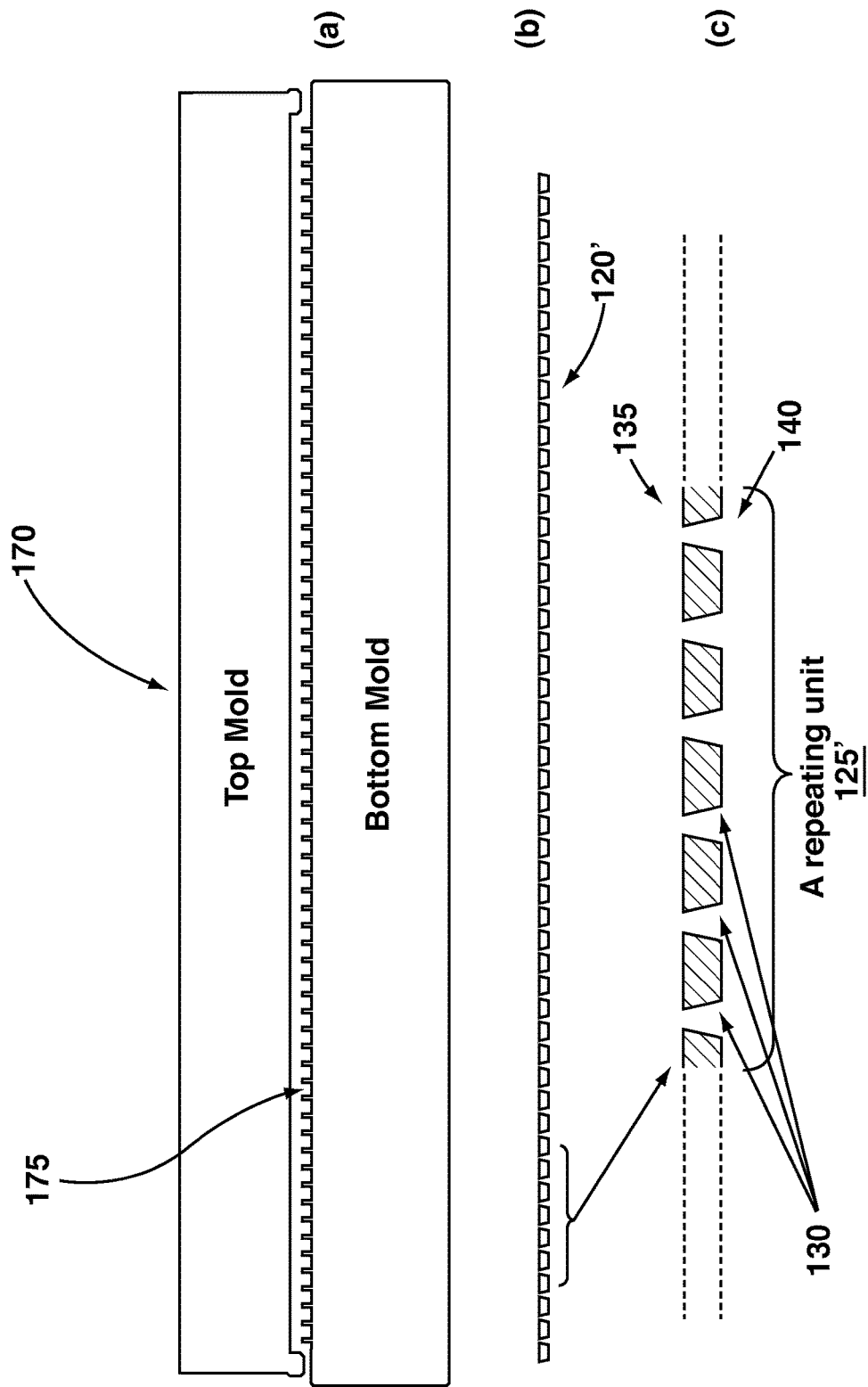
FIG. 12, comprising

In further variations, the dielectric portion 120 of section 125 can be created in accordance with a molding process as shown in FIG. 12. FIG. 12(a) shows a cross-section of a mold 170. FIG. 12(b) shows a cross section of a molded dielectric portion 120'. FIG. 12 (c) shows a magnified section 125' of the cross-section of the molded dielectric portion 120'. Dielectric material can be formed into dielectric portion 120' using mold 170 by inserting the dielectric material into the mold cavity 175. The dielectric material may be a polymerized molding compound based, for example, on a binding material such as an epoxy and filled with inorganic fillers such as silicon dioxide or silicon carbide, or it may be any other suitable plastic compound. The dielectric material can be formed into any predetermined thickness and shape by adjusting the mold cavity size and shape. An example thickness for dielectric portion 120' is approximately 0.1 mm. Exemplary dielectric portion 120' shapes that can be formed include a panel, a strip or a wafer, as previously discussed. In some implementations, the dielectric material may be formed with fully or partially populated cavities and/or micro-cavities 130, as indicated in FIG. 12. Cavities 130 can be any predetermined shape. For example, and as shown in FIG. 12, the cavities can be conical through holes with smaller openings on the top surface 135 and larger openings at bottom surface 140.

Figure 13:
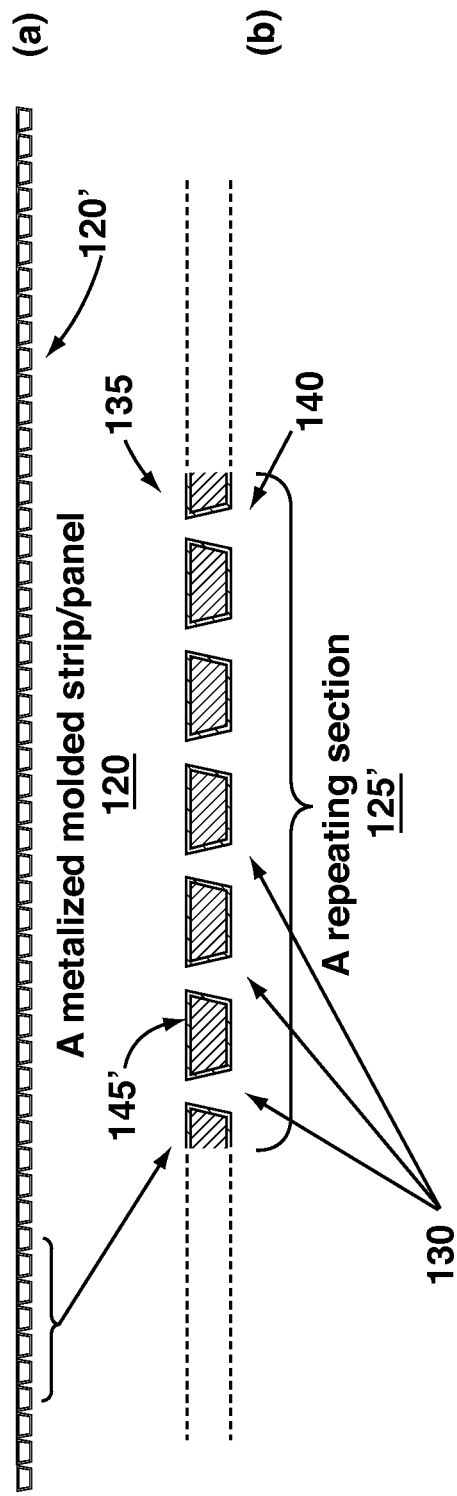
FIG. 13, comprising FIGS. 13(a) and (b), shows a cross-sectional view of a carrier in accordance with an aspect of the invention.

Once the dielectric portion 120 is molded, its exposed surface can be metalized directly as indicated at 145' in FIG. 13. The metallization can be achieved in the manner described above. For example, a seed layer of metal can be put directly on the surface of the dielectric portion 120' by means of sputtering on a metal seed layer (such as titanium, chromium, copper, etc). Alternatively, immersion metal plating can be used. Once the seeding or immersion plating is complete, electrolytic plating can be utilized to plate up sufficient metal (e.g. copper) to achieve the selected thickness.

Figure 14:
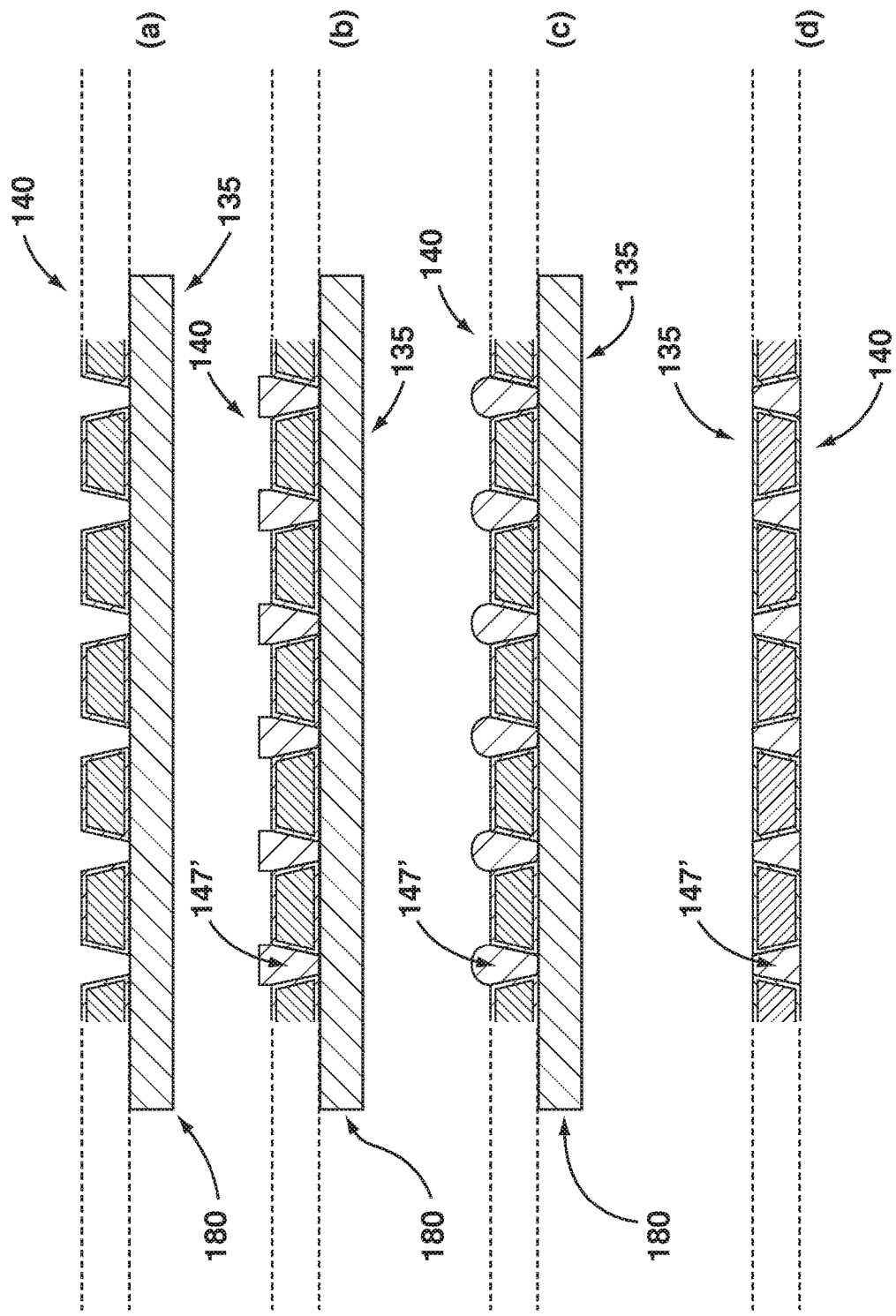
FIG. 14, comprising

Once metalized, the cavities 130 of dielectric portion 130 can then be filled with solder metal 147'. In some implementations, to achieve this, as shown in FIG. 14 (a), high temperature resistant tape 180 is applied to the top surface 135 of the dielectric portion 120. Solder paste is then stencil printed using a predetermined stencil thickness as shown in FIG. 14(b). The printed solder paste is then reflowed as indicated at FIG. 14(c). Finally, the tape 180 can be removed and the reflowed solder paste can be flattened, by rolling or coining, for example, on both sides of the dielectric portion 120' as indicated at FIG. 14(d).

Figure 15:
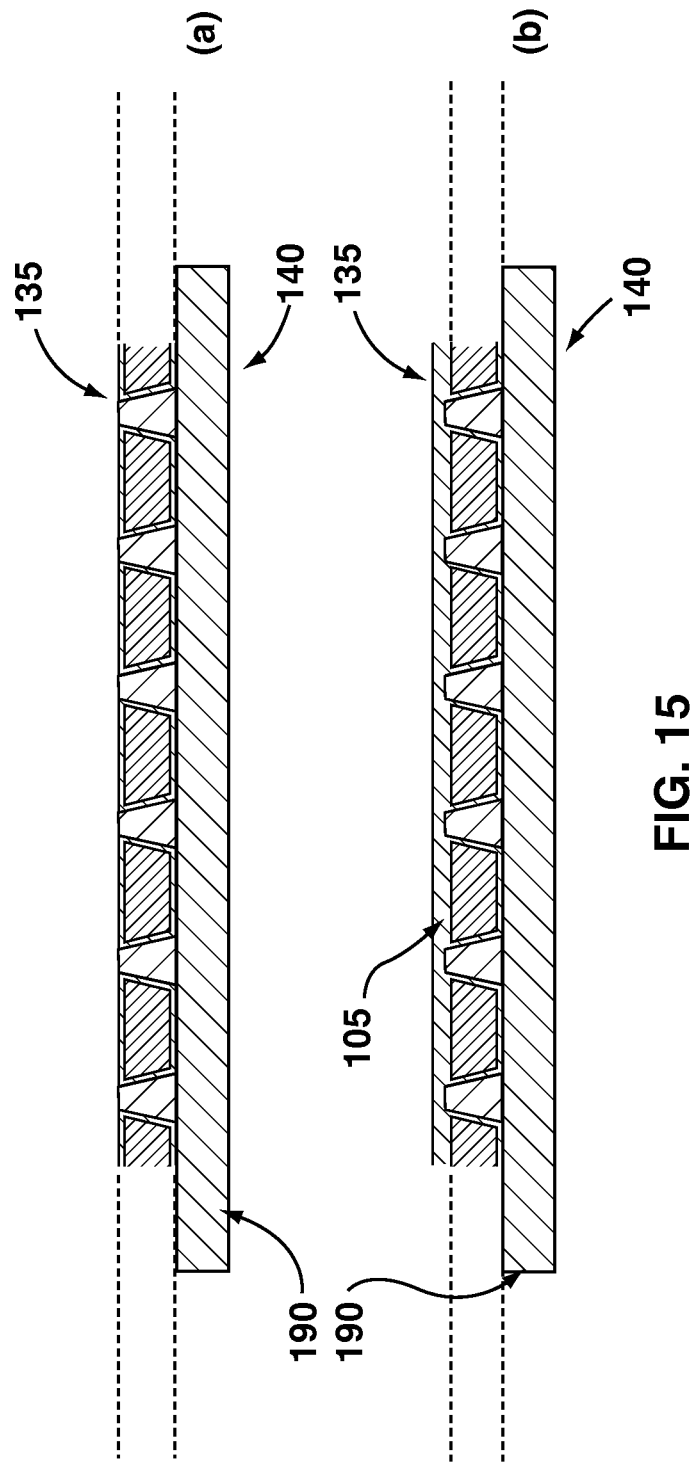
FIG. 15, comprising FIGS. 15(a) and (b), shows a cross-sectional view of a carrier in accordance with an aspect of the invention.

Metal can be further plated onto the top surface 135 of the plastic portion 120' as indicated in FIG. 15. The thickness can be predetermined to be 8 um or 5 um or thinner, for example. To achieve such plating, bottom surface 140 of the dielectric portion 120' is masked with plate resist 190, as shown in FIG. 15(a). Electrolytic plating can then be used to plate the top surface 135 of dielectric portion 120' with metals such as copper to a predetermined thickness to form the conductive portion 105, as indicated at FIG. 15(b). The carrier thus formed can be selectively plated and assembled with an integrated circuit in a similar manner as described above at 230 through 260, after removing the applied mask 190 at the appropriate step of the process. For example, the mask can be removed after forming the conductive portion 105 through plating. Alternatively, the mask may be removed after performing the selective plating of 230; since mask 190 is on the bottom surface 140, when plating, this may mean not applying plate resist to the bottom surface 140 during the plating process of 230.

Figure 16:
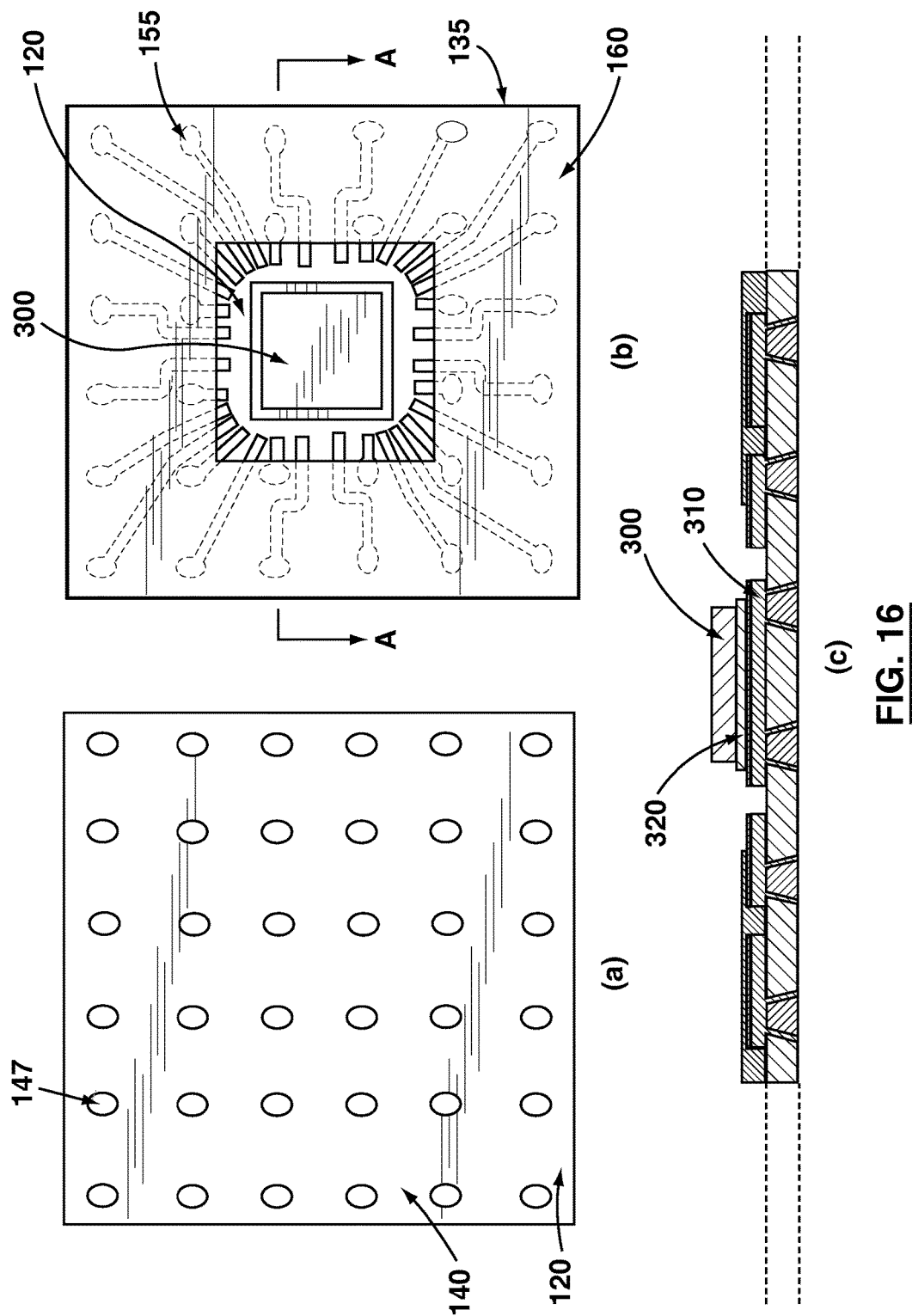
FIG. 16, comprising
Figure 17:
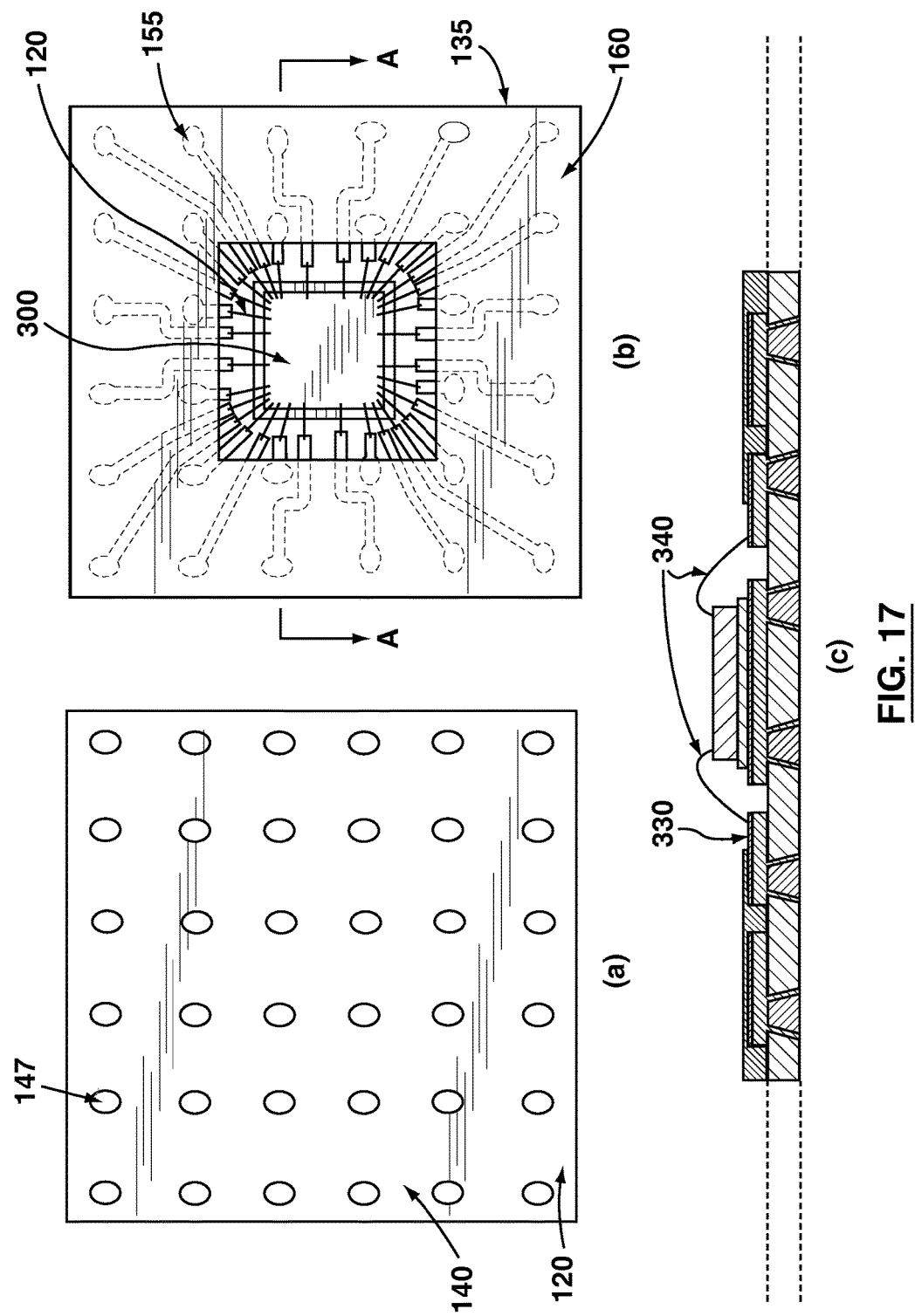
FIG. 17, comprising
Figure 18:
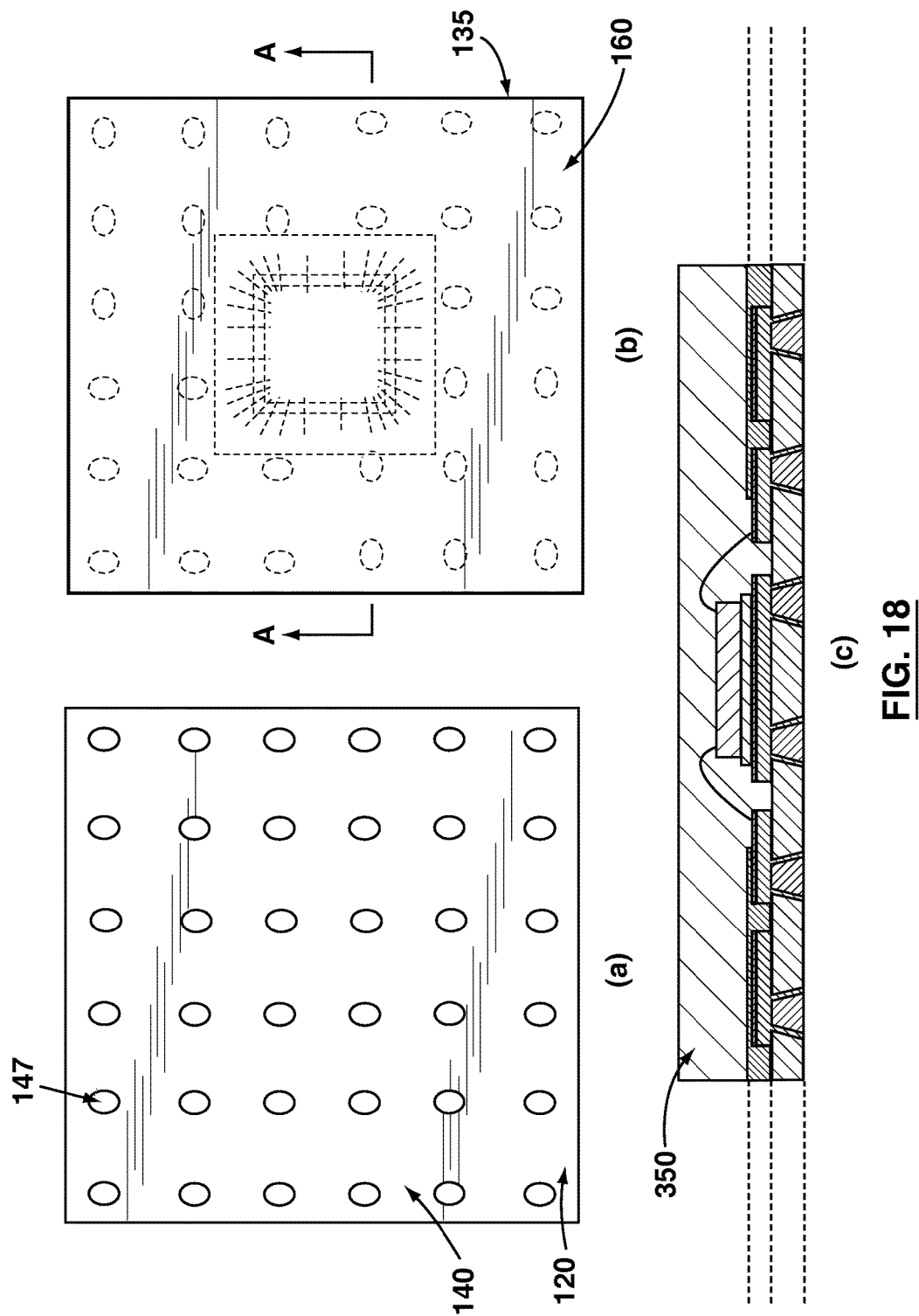
FIG. 18, comprising
Figure 19:
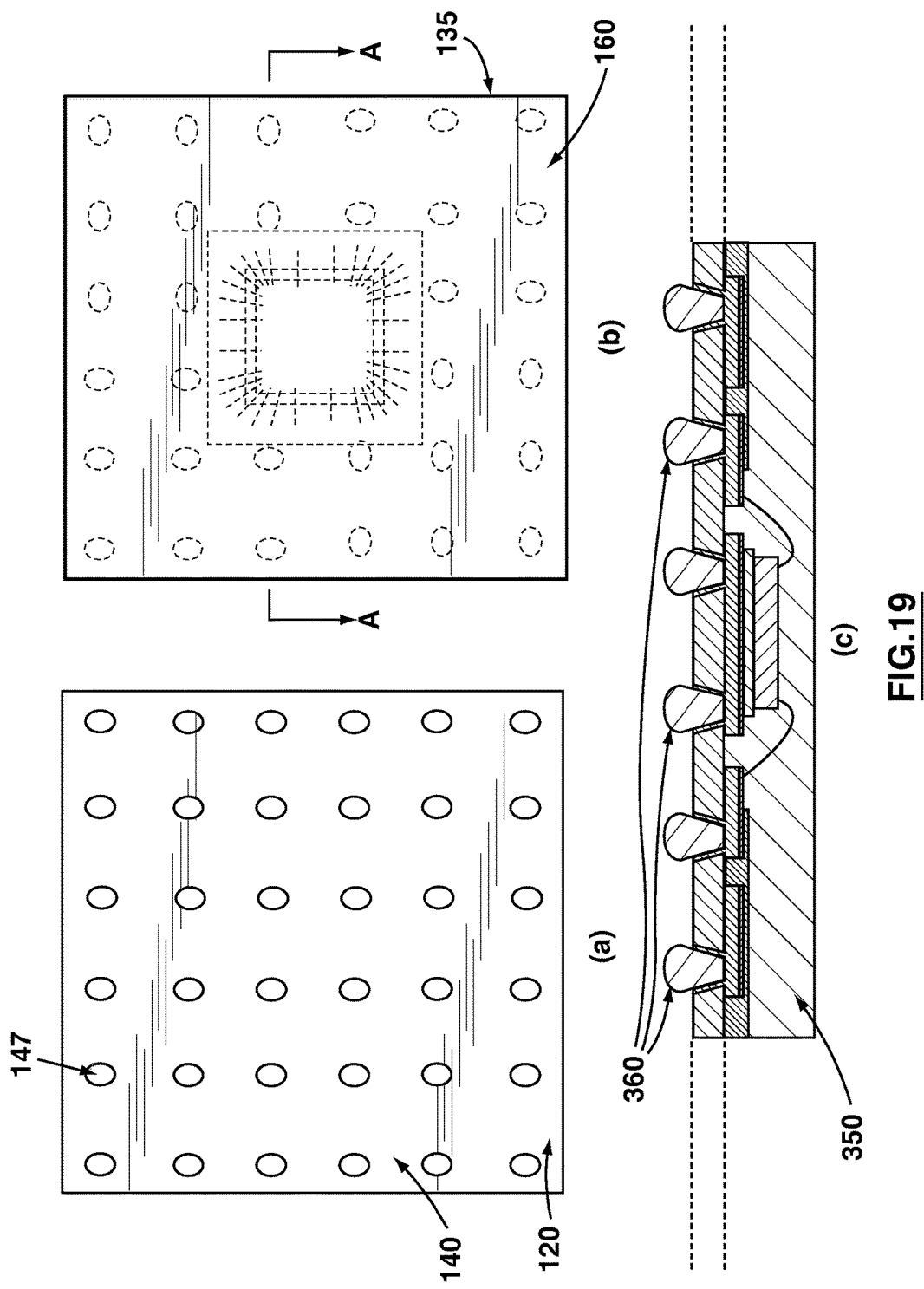
FIG. 19, comprising

Returning to step 260 of the process, according to one implementation, as shown in FIG. 16, a die 300 can be attached to die attach paddle 310 using epoxy 320 (either electrical conductive or non conductive). Then as shown in FIG. 17, the bond pads on the die 300 can be connected to bonding traces 330 on the carrier by means of bonded wires 340 comprising Au, Cu or Ag for example. As shown in FIG. 18, over molding 350 can be used to encapsulate/passivate the bonded wires, die and exposed top surface 135 of the carrier. As shown in FIG. 19, solder balls 360 can be attached and reflowed onto the bottom surface 140 of the carrier with pre-filled solder in contact with solder metal 147 at island cavities 130. Thereafter, the individual assembled sections 125 can be singulated, by means of sawing for example, from the strip or panel, as discussed above.

Figure 20:
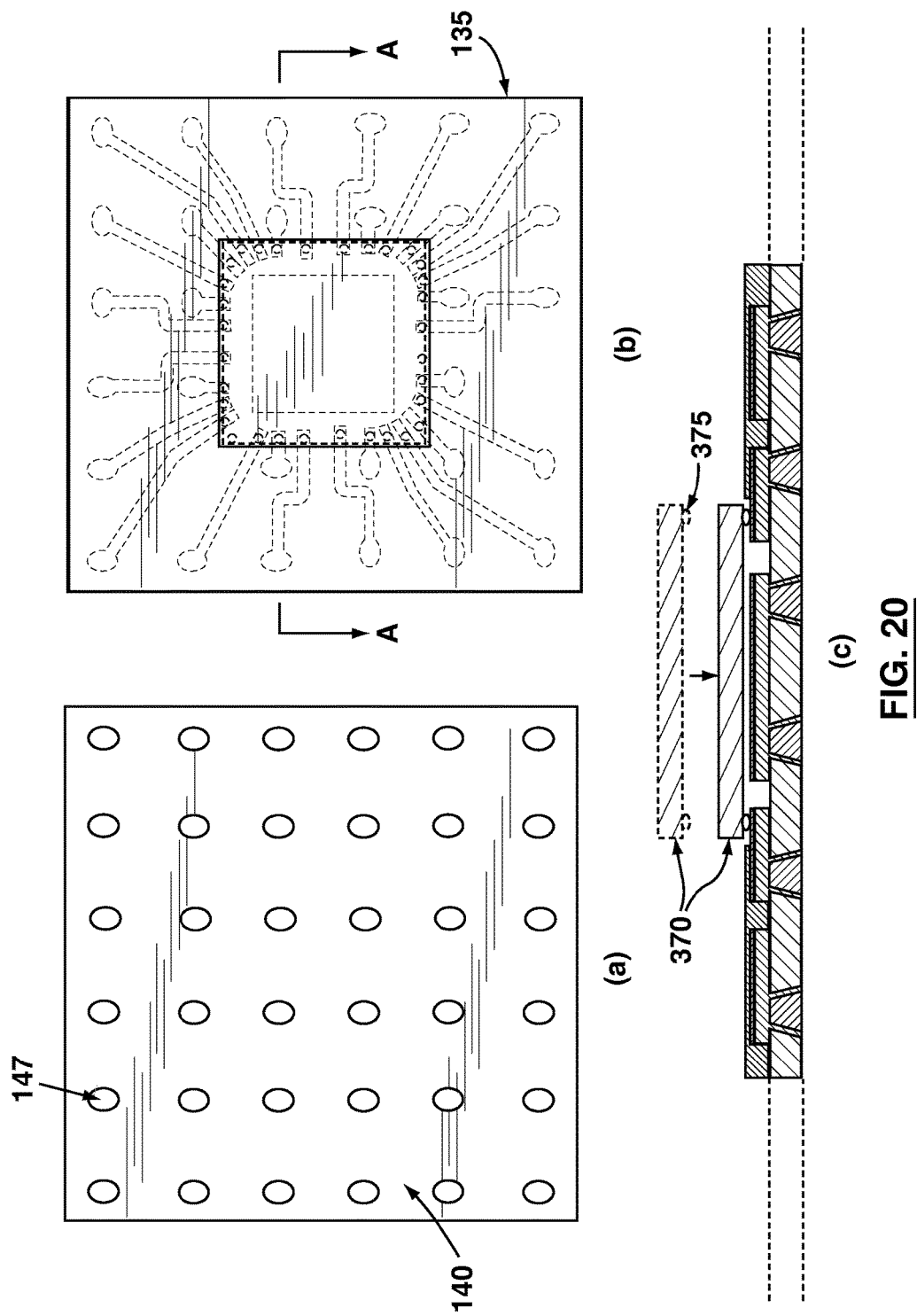
FIG. 20, comprising
Figure 21:
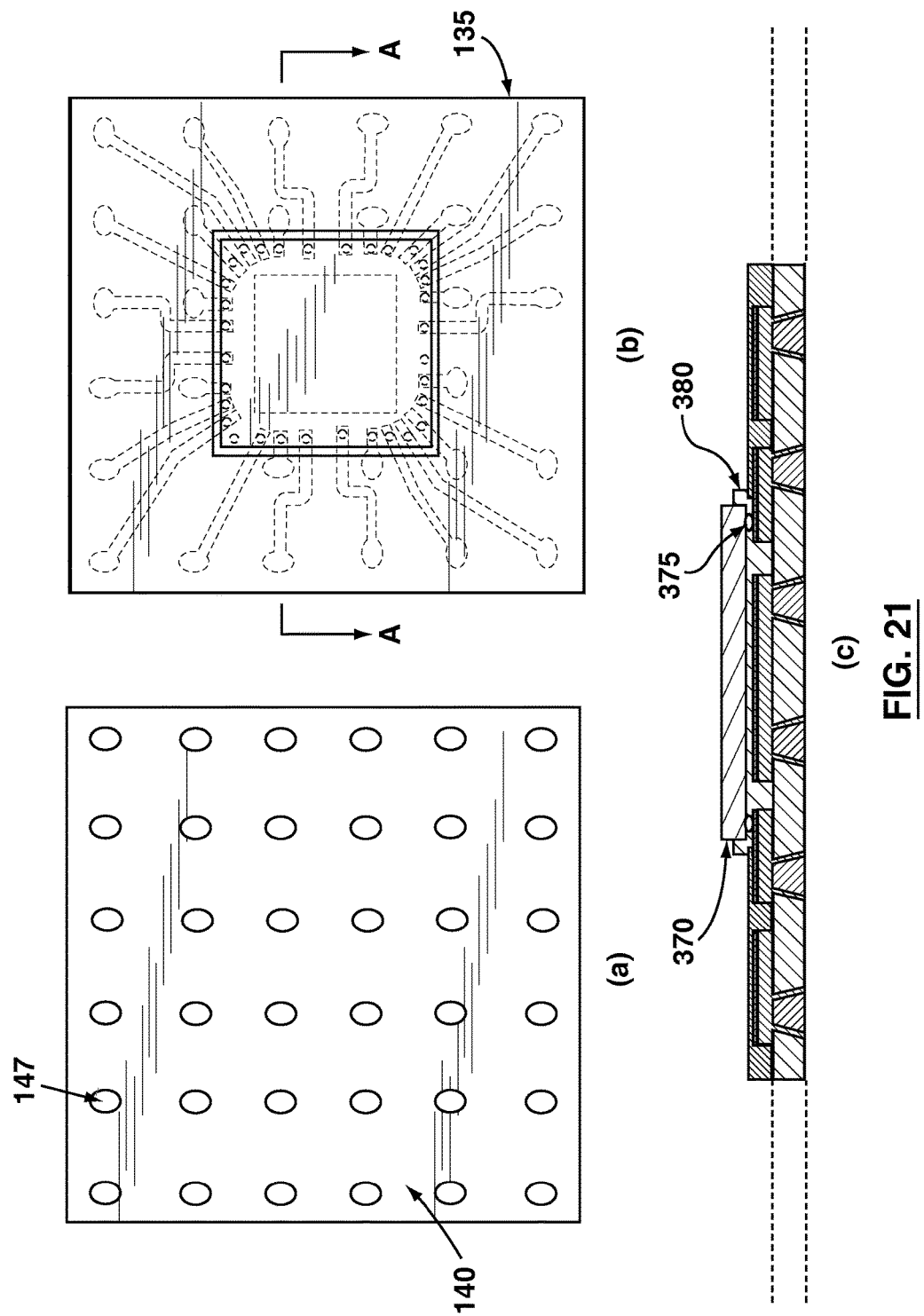
FIG. 21, comprising
Figure 22:
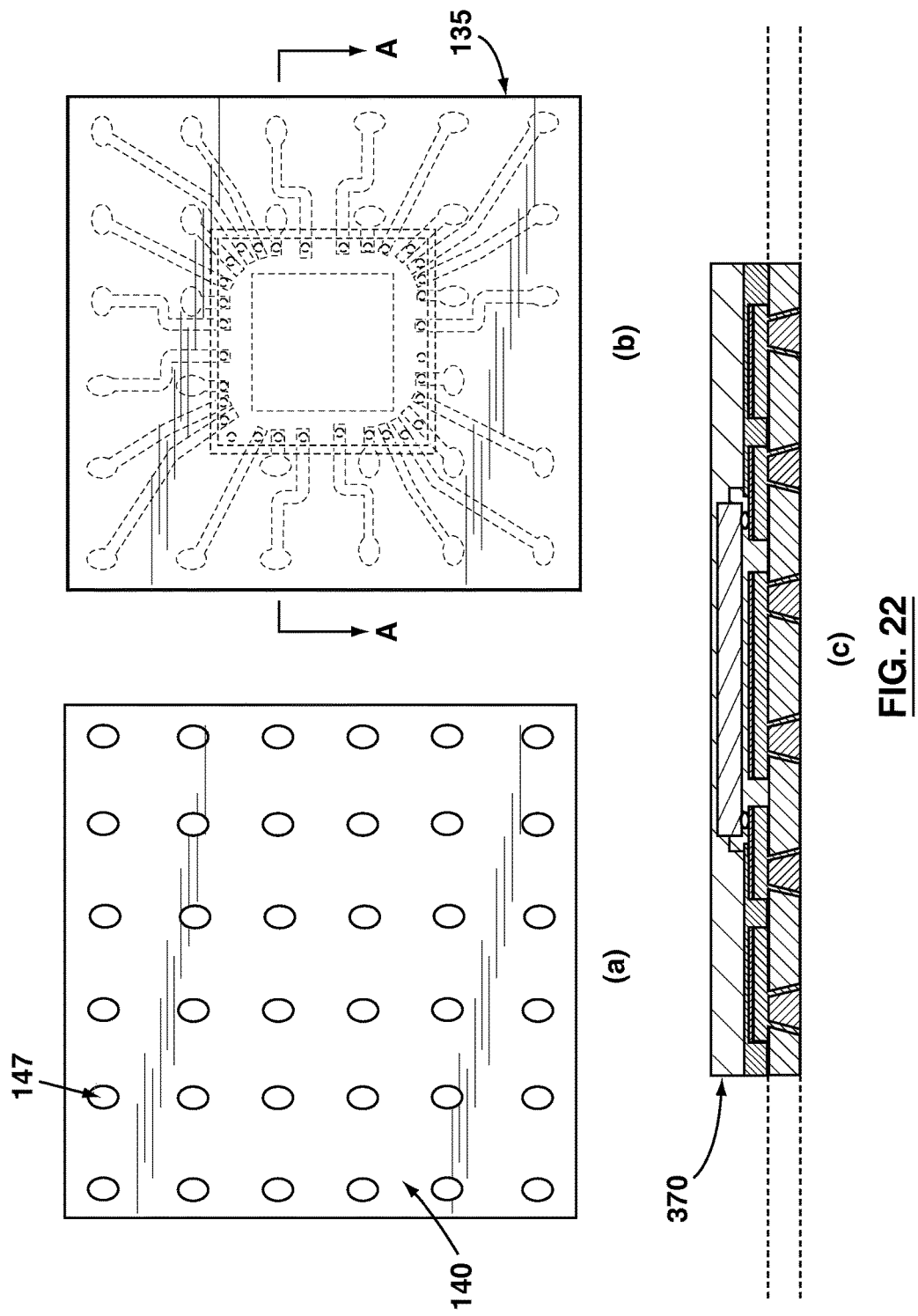
FIG. 22, comprising
Figure 23:
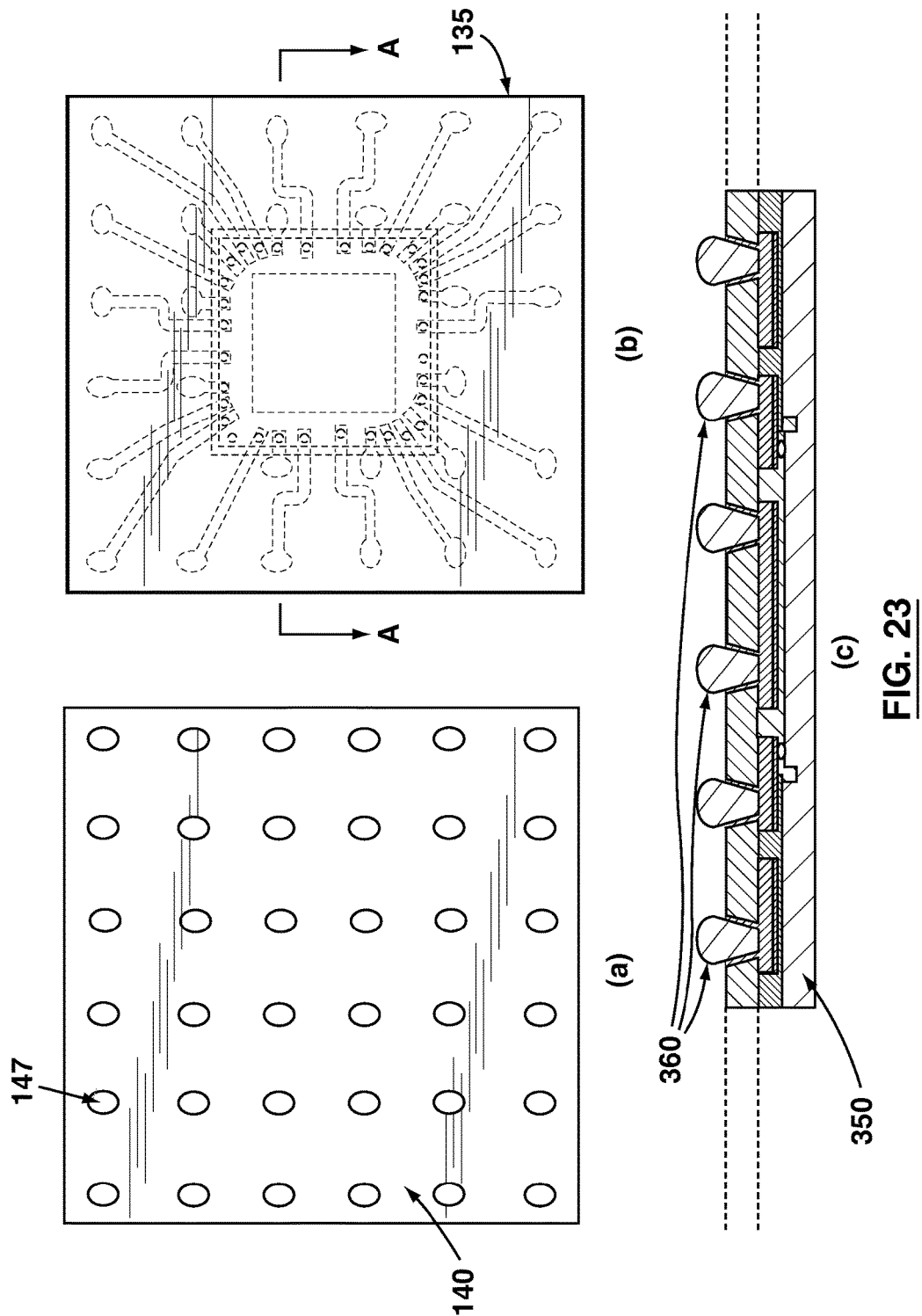
FIG. 23, comprising

According to a variant implementation, as shown in FIG. 20, a pre-bumped flip chip die (IC) 370 (solder bump or copper pillar bump with solder cap 375) can be attached to the section 125 by means of mass reflow or thermal compression process, wherein the downward arrow indicates the direction of compression. As shown in FIG. 21 at 380, the gap between the Flip Chip die and the carrier can be underfilled. As shown in FIG. 22, the die and the rest of the exposed top surface of the carrier can be encapsulated by over molding 350. As shown in FIG. 23, solder balls 360 can be attached and reflowed onto the bottom surface 140 of the carrier with pre-filled solder in contact with solder metal 147 at island cavities 130. Thereafter, the individual assembled sections 125 can be singulated, by means of sawing for example, from the strip or panel, as discussed above.

The above-described embodiments are intended to be examples and alterations and modifications may be effected thereto, by those of skill in the art, without departing from the scope which is defined solely by the claims appended hereto. For example, methods, systems and embodiments discussed can be varied and combined, in full or in part.

I claim:

1. A method of fabricating a carrier having a top surface and a bottom surface, the method comprising:
   combining a conductive portion at the top surface of the carrier and a dielectric portion at the bottom surface of the carrier, said dielectric portion including contact island cavities;
   filling one or more of the contact island cavities with solder metal to form solder islands;

selectively metal plating the conductive portion;
selectively etching a portion of said conductive portion; and
applying solder resist to the selectively plated and etched top surface of said conductive portion; wherein
the filling one or more of the contact island cavities with solder metal comprises stencil printing solder paste onto the dielectric portion at the bottom surface and then reflowing the dielectric portion with the solder paste; and
the solder islands are flattened after reflowing the dielectric portion.

2. The method of claim 1, further including metalizing at least a portion of a surface of the dielectric portion that includes the contact island cavities prior to filling the contact island cavities with solder metal.

3. The method of claim 2, wherein said metalizing comprises one of either sputtering a metal seed layer onto the dielectric portion or immersing the dielectric portion in a molten metal.

4. The method of claim 3, wherein said metal seed layer comprises one of chromium or titanium.

5. The method of claim 3, wherein said molten metal comprises copper.

6. The method of claim 2, further comprising electrolytic plating the metalized portion of the surface of the dielectric portion to a predetermined thickness.

7. The method of claim 1, wherein the solder metal comprises one of either SnAg, SnAgCu or SnCu.

8. The method of claim 1, wherein the solder islands are flattened by one of either pressurized rolling or coining.

9. The method of claim 1, wherein selective plating comprises depositing metal on the conductive portion, applying a photo-imageable plating resist to the deposited metal, exposing the top surface to a predetermined image shape and/or pattern, developing the plating resist, and stripping away the plating resist.

10. The method of claim 9, wherein the deposited metal comprises one of either Ag, Ni/Au or Pd.

11. The method of claim 1, wherein selectively etching a portion of said conductive portion comprises etching away portions of the conductive portion that have not been selectively plated, thereby exposing portions of dielectric portion at the top surface.

12. The method of claim 11, wherein selectively etching a portion of said conductive portion comprises applying photo imageable etching resist to the top surface, exposing a predetermined image pattern, developing the etching resist, and stripping away the etching resist.

13. The method of claim 1, wherein the dielectric portion is fabricated by inserting dielectric material into a mold cavity, molding the dielectric material into a predetermined thickness and shape by adjusting the mold cavity size and shape.

14. The method of claim 13, wherein the predetermined thickness is approximately 0.1 mm and the shape is one of either a panel, a strip or a wafer.

15. The method of claim 14, wherein the contact island cavities are conical with openings at the top surface that are smaller than openings at bottom surface.

16. The method of claim 13, wherein the dielectric material is a polymerized molding compound based on a binding material.

17. The method of claim 16, wherein the binding material comprises an epoxy filled with one or more inorganic fillers.

18. The method of claim 17, wherein the inorganic fillers include one of either silicon dioxide or silicon carbide.

19. A method of fabricating a carrier having a top surface and a bottom surface, the method comprising:
combining a conductive portion at the top surface of the carrier and a dielectric portion at the bottom surface of the carrier, said dielectric portion including contact island cavities;
filling one or more of the contact island cavities with solder metal to form solder islands;
selectively metal plating the conductive portion;
selectively etching a portion of said conductive portion; and
applying solder resist to the selectively plated and etched top surface of said conductive portion; wherein
the filling one or more of the contact island cavities with solder metal comprises applying high temperature resistant tape to the dielectric portion at the top surface, stencil printing solder paste onto the dielectric portion at the bottom surface, removing the tape, reflowing the dielectric portion with the solder paste, and flattening the reflowed solder paste by one of either rolling or coining.

20. The method of claim 19, wherein selective plating comprises applying a plating resist to the dielectric portion at the bottom surface, electrolytic plating the dielectric portion at the top surface to a predetermined thickness, and removing the plating resist.

21. The method of claim 20, wherein the predetermined thickness is less than at least 8 um or 5 um.

* * * * *